(12) United States Patent
Satou et al.

(10) Patent No.: US 10,942,225 B2
(45) Date of Patent: Mar. 9, 2021

(54) WIRING OPEN DETECTION CIRCUIT

(71) Applicants: Kabushiki Kaisha Toshiba, Tokyo (JP); Toshiba Electronic Devices & Storage Corporation, Tokyo (JP)

(72) Inventors: Youichi Satou, Kanagawa (JP); Masazumi Shiochi, Tokyo (JP); Satoko Susa, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 142 days.

(21) Appl. No.: 16/266,135

(22) Filed: Feb. 4, 2019

(65) Prior Publication Data

US 2020/0018788 A1 Jan. 16, 2020

(30) Foreign Application Priority Data

Jul. 10, 2018 (JP) .............................. JP2018-130394

(51) Int. Cl.
*G01R 31/04* (2006.01)
*G01R 31/67* (2020.01)
*G01R 31/28* (2006.01)

(52) U.S. Cl.
CPC .......... *G01R 31/67* (2020.01); *G01R 31/2884* (2013.01)

(58) Field of Classification Search
CPC ...... G01R 31/31715; G01R 31/318572; G01R 31/3177; G01R 31/318505; G01R 31/318511; G01R 31/318533; G01R 31/70; G01R 31/2812; G01R 31/2813; G01R 31/2853; G01R 31/2884; G01R 31/2855; G01R 31/3163; G01R 31/318513; G01R 31/50; G01R 31/52; G01R 31/54; G01R 31/67; H01L 22/14; H01L 27/3276; H01L 51/0031; H03M 1/765; H04M 1/24; H04M 3/08; H04M 3/26; H04M 3/323; H05K 1/0268; H02H 3/04; H04B 3/46; G06F 11/22; G06F 1/3209; G09B 9/20;

(Continued)

(56) References Cited

U.S. PATENT DOCUMENTS 4,056,773 A * 11/1977 Sullivan ................. G01R 31/54
324/500
5,124,660 A * 6/1992 Cilingiroglu .......... G01R 31/70
324/538

(Continued)

FOREIGN PATENT DOCUMENTS

JP 2001-296330 A 10/2001
JP 2006-228989 A 8/2006

(Continued)

*Primary Examiner* — Vinh P Nguyen
(74) *Attorney, Agent, or Firm* — White & Case LLP

(57) ABSTRACT

In one embodiment, a wiring open detection circuit includes a signal processing circuit, a terminal, a diode, and an open decision circuit. The signal processing circuit is connected to one end of a first wiring and outputs a signal processed signal to the first wiring. The terminal is connected to the other end of the first wiring. The diode has one end connected to the terminal. The open decision circuit applies a first voltage to the other end of the diode, and detects change in a current flowing in the first wiring to decide whether or not the first wiring is open.

9 Claims, 15 Drawing Sheets

(58) Field of Classification Search
CPC ......... H03K 19/1736; H03K 19/17704; H04Q 1/20; H04Q 2213/13162
See application file for complete search history.

(56) References Cited

U.S. PATENT DOCUMENTS

| | | | |
|---|---|---|---|
| 7,030,623 B1* | 4/2006 | Carpenter | G01R 31/006 |
| | | | 324/542 |
| 2003/0025518 A1* | 2/2003 | Berkely | G01R 31/2812 |
| | | | 324/762.01 |
| 2006/0180898 A1 | 8/2006 | Funaki et al. | |
| 2013/0293251 A1* | 11/2013 | Martin | H04L 12/40039 |
| | | | 324/750.3 |

FOREIGN PATENT DOCUMENTS

| | | |
|---|---|---|
| JP | 2010-221372 A | 10/2010 |
| JP | 2012-042226 A | 3/2012 |

* cited by examiner

|  | Vtb (TEST BUS APPLIED VOLTAGE) |
|---|---|
| NORMAL OPERATION | Vss |
| WIRING OPEN TEST | Vtb > Vf (FORWARD VOLTAGE) |

FIG. 3A

| Itest | DECISION |
|---|---|
| CHANGE | WIRING NORMAL |
| CONSTANT (NO CHANGE) | OPEN FAILURE |

FIG. 3B

| Sin | Sout | DECISION |
|---|---|---|
| Vdd1 | Vdd1(H)/Vss(L) | WIRING NORMAL |
| Vss | Vss | OPEN FAILURE |

FIG. 6

|  | TEST BUS APPLIED VOLTAGE (Vtb1, Vtb2) |
|---|---|
| NORMAL OPERATION | Vtb1, Vtb2=Vss |
| WIRING OPEN TEST I (TB21~D21~DNK1~MW21) | Vtb1>Vf<br>Vtb2=Vss |
| WIRING OPEN TEST II (TB22~D22~DNK2~VIA2~DNK3~VIA1~DNK1~MW21) | Vtb1=Vss<br>Vtb2>Vf |

FIG. 9A

| Itest | DECISION |
|---|---|
| CHANGE | WIRING NORMAL |
| CONSTANT (NO CHANGE) | OPEN FAILURE |

FIG. 9B

|  | Vtb (TEST BUS APPLIED VOLTAGE) |
|---|---|
| NORMAL OPERATION | Vss |
| WIRING OPEN TEST | Vtb > Vbk (BREAKDOWN VOLTAGE) |

FIG. 11A

| Itest | DECISION |
|---|---|
| CHANGE | WIRING NORMAL |
| CONSTANT (NO CHANGE) | OPEN FAILURE |

FIG. 11B

| | TEST BUS APPLUED VOLTAGE (Vtb1, Vtb2, Vtb3) |
|---|---|
| NORMAL OPERATION | Vtb1, Vtb2, Vtb3=Vss |
| WIRING OPEN TEST (TB33~DNK14~VIA14~DNK22~VIA13 ~DNK13~D42~DNK12~VIA12~DNK21 ~VIA11~DNK11~MW21) | Vtb3>Vf Vtb1, Vtb2=Vss |

FIG. 15A

| Itest | DECISION |
|---|---|
| CHANGE | WIRING NORMAL |
| CONSTANT (NO CHANGE) | OPEN FAILURE |

FIG. 15B

WIRING OPEN DETECTION CIRCUIT

CROSS REFERENCE TO RELATED APPLICATION

This application is based upon and claims the benefit of priority from the prior Japanese Patent Application No. 2018-130394, filed on Jul. 10, 2018, the entire contents of which are incorporated herein by reference.

FIELD

Embodiments described herein relate to a wiring open detection circuit.

BACKGROUND

Recently, in a semiconductor integrated circuit, systematization and high integration by taking in a lot of functions are progressing, multi-chip packaging and multi-chip modularization, and so on using a lot of semiconductor integrated circuits are progressing. Making the number of wirings of a semiconductor integrated circuit to be a lot of numbers and making the wirings to have long distances, and making wirings to connect between semiconductor integrated circuit chips to have long distances are also developing.

For the reason, in the semiconductor integrated circuit, it has become very important to detect open/short of wirings. As a method of detecting open/short of wirings, a failure analysis device using an optical signal, an electric signal, and so on, for example, is frequently used. When the failure analysis device is used, advance preparation for analysis, software for analysis, and so on are required, and accordingly there is a problem in which performing a rapid failure analysis with a simple configuration is difficult.

BRIEF DESCRIPTION OF THE DRAWINGS

FIG. 3A is a diagram showing an applied voltage in the wiring open test according to the first embodiment.

FIG. 3B is a diagram showing decision result in the wiring open test according to the first embodiment.

FIG. 6 is a diagram showing decision result in the wiring open test according to the second embodiment.

FIG. 9A is a diagram showing an applied voltage in a wiring open test according to the fourth embodiment.

FIG. 9B is a diagram showing decision result in the wiring open test according to the fourth embodiment.

FIG. 11A is a diagram showing an applied voltage in a wiring open test of the first modification.

FIG. 11B is a diagram showing decision result in the wiring open test of the first modification.

FIG. 15A is a diagram showing an applied voltage in a wiring open test of the fourth modification.

FIG. 15B is a diagram showing decision result in the wiring open test of the fourth modification.

DETAILED DESCRIPTION

Figure 1:
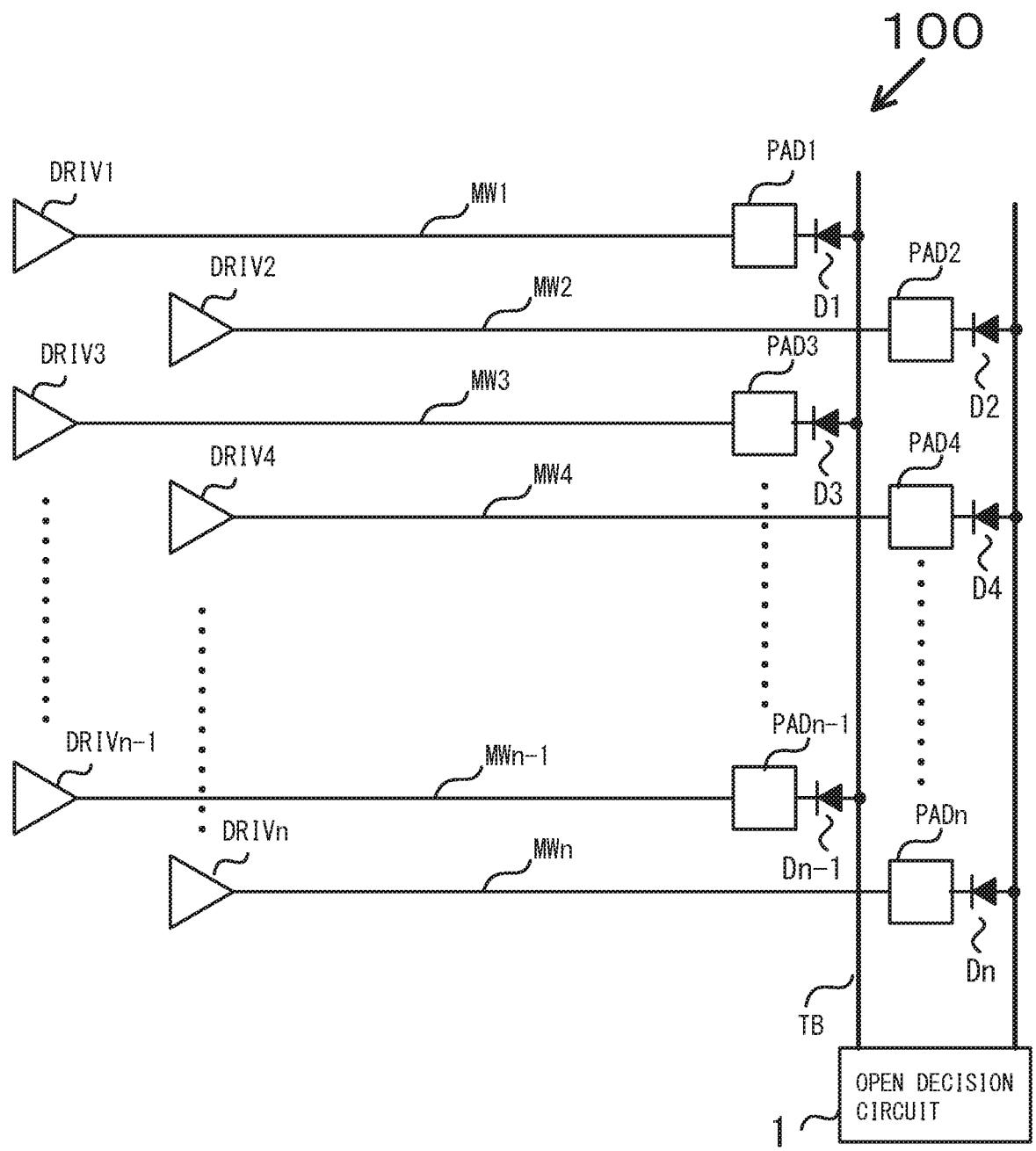
FIG. 1 is a circuit diagram showing a wiring open detection circuit according to a first embodiment.

According to one embodiment, a wiring open detection circuit includes a signal processing circuit, a terminal, a diode, and an open decision circuit. The signal processing circuit is connected to one end of a first wiring and outputs a signal processed signal to the first wiring. The terminal is connected to the other end of the first wiring. The diode has one end connected to the terminal. The open decision circuit applies a first voltage to the other end of the diode, and detects change in a current flowing in the first wiring to decide whether or not the first wiring is open.

Hereinafter, further embodiments will be described with reference to the drawings. In the drawings, the same symbols indicate the same or the similar portions.

A wiring open detection circuit according to a first embodiment will be described with reference to the drawings. FIG. 1 is a circuit diagram showing a wiring open detection circuit.

In the first embodiment, as open detection of a long distance wiring to connect between a driver and a terminal, a diode and a test bus are provided between the terminal and an open decision circuit. The open decision circuit applies a voltage to the diode via the test bus and detects change in a current flowing in the long distance wiring to decide whether or not the long distance wiring is open.

As shown in FIG. 1, a wiring open detection circuit 100 includes drivers DRIV1-DRIV4, a driver DRIVn−1, a driver DRIVn, wirings MW1-MW4, a wiring MWn−1, a wiring MWn, terminals PAD1-PAD4, a terminal PADn−1, a terminal PADn, diodes D1-D4, a diode Dn−1, a diode Dn, a test bus TB, and an open decision circuit 1.

In the first embodiment, the diodes D1-D4, the diode Dn−1, the diode Dn, and the test bus TB are provided to a semiconductor integrated circuit (not shown) including the drivers DRIV1-DRIV4, the driver DRIVn−1, the driver DRIVn, the wirings MW1-MW4, the wiring MWn−1, the wiring MWn, the terminals PAD1-PAD4, the terminal PADn−1, and the terminal PADn, and the open decision circuit 1 decides whether or not each of the wirings MW1-MW4, the wiring MWn−1, and the wiring MWn that are long distance wirings is open.

The drivers DRIV1-DRIV4, the driver DRIVn−1, and the driver DRIVn are each a signal processing circuit to execute signal processing which is provided at an output side of the semiconductor integrated circuit.

The wirings MW1-MW4, the wiring MWn−1, and the wiring MWn are each a metal wiring having a wiring length of not less than 1 mm (7 mm, for example) and are arranged in parallel with each other.

The wiring MW1 has one end connected to the driver DRIV1, and the other end connected to the terminal PAD1 outputs a signal processed signal executed in the driver DRIV1 to the terminal PAD1. The wiring MW2 has one end connected to the driver DRIV2, and the other end connected to the terminal PAD2 outputs a signal processed signal executed in the driver DRIV2 to the terminal PAD2. The wiring MW3 has one end connected to the driver DRIV3, and the other end connected to the terminal PAD3 outputs a signal processed signal executed in the driver DRIV3 to the terminal PAD3. The wiring MW4 has one end connected to the driver DRIV4, and the other end connected to the terminal PAD4 outputs a signal processed signal executed in the driver DRIV4 to the terminal PAD4. The wiring MWn−1 has one end connected to the driver DRIVn−1, and the other end connected to the terminal PADn−1 outputs a signal processed signal executed in the driver DRIVn−1 to the terminal PADn−1. The wiring MWn has one end connected to the driver DRIVn, and the other end connected to the terminal PADn outputs a signal processed signal executed in the driver DRIVn to the terminal PADn.

The diode D1 has one end (cathode) connected to the terminal PAD1, and the other end (anode) connected to the test bus TB. The diode D2 has one end (cathode) connected to the terminal PAD2, and the other end (anode) connected to the test bus TB. The diode D3 has one end (cathode) connected to the terminal PAD3, and the other end (anode) connected to the test bus TB. The diode D4 has one end (cathode) connected to the terminal PAD4, and the other end (anode) connected to the test bus TB. The diode Dn−1 has one end (cathode) connected to the terminal PADn−1, and the other end (anode) connected to the test bus TB. The diode Dn has one end (cathode) connected to the terminal PADn, and the other end (anode) connected to the test bus TB. The open decision circuit 1 is connected to the test bus TB.

Short failure between long distance wirings arranged adjacently is decided such that currents from the drivers arranged adjacently are detected, and whether or not the wirings are short circuited is decided, for example. Here the detailed description thereof will be omitted.

Figure 2:
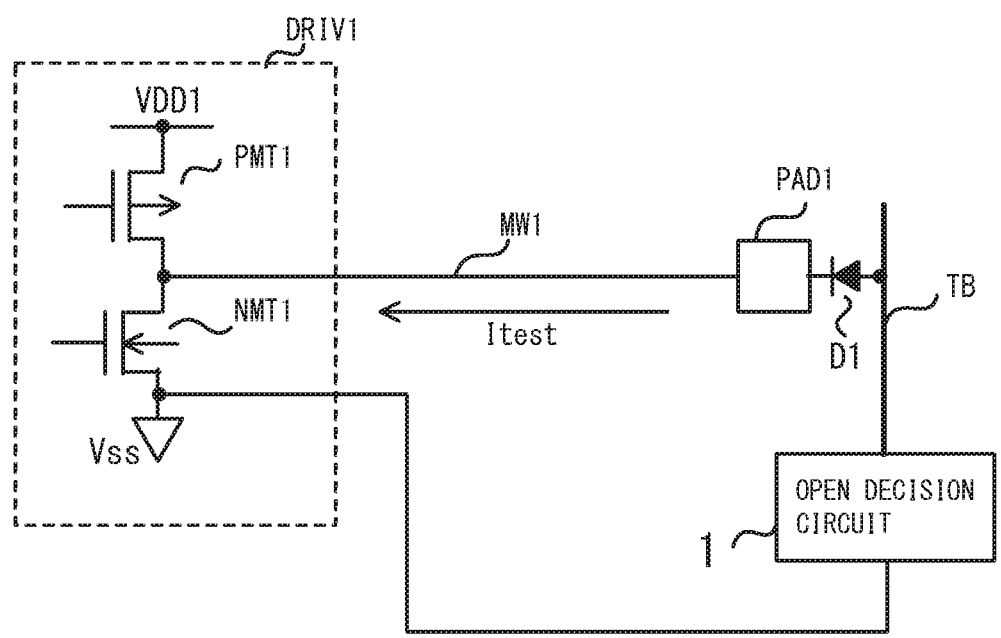
FIG. 2 is a circuit diagram showing a wiring open test according to the first embodiment.

Next, a wiring open test will be described with reference to FIG. 2, FIG. 3A and FIG. 3B. FIG. 2 is a circuit diagram showing a wiring open test. FIG. 3A is a circuit diagram showing an applied voltage in the wiring open test. FIG. 3B is a diagram showing decision result in the wiring open test. Here, an open test of the wiring MW1 will be described as an example. Open tests of the wirings MW2-MW4, the wiring MWn−1, and the wiring MWn are the same as that of the wiring MW1, and accordingly, the description thereof will be omitted.

As shown in FIG. 2, the driver DRIV1 is an output buffer composed of a transistor PMT1 and a transistor NMT1. The transistor PMT1 is a P-channel MOS transistor, and has a source connected to a power source (high potential side power source) VDD1, and a drain connected to the one end of the wiring MW1. The transistor NMT1 is an N-channel MOS transistor, and has a drain connected to the drain of the transistor PMT1 and the one end of the wiring MW1, and a source connected to a ground side potential (low potential side power source) Vss. The ground side potential Vss is lower than a potential of the power source (high potential side power source) VDD1.

The open decision circuit 1 has one end connected to the test bus TB, and the other end connected to the source of the MOS transistor NMT1.

At the time of a wiring open test, the open decision circuit 1 applies a test bus applied voltage Vtb (first voltage) to the other end (anode) of the diode D1 via the test bus TB. The open decision circuit 1 detects change in a current Itest flowing in the wiring MW1 (first wiring) to decide whether or not the wiring MW1 is open.

As shown in FIG. 3A, at the time of normal operation of the semiconductor integrated circuit, the test bus applied voltage Vtb which the open decision circuit 1 applies is set to the ground side potential Vss, and a signal outputted from the driver DRIV1 is outputted to the outside via the terminal PAD1.

At the time of the wiring open test, the test bus applied voltage Vtb which the open decision circuit 1 applies is set to a positive voltage (first voltage) larger than a forward voltage Vf of the diode D1.

As shown in FIG. 3B, the open decision circuit 1 decides that the wiring MW1 is normal (not disconnected) when the current Itest flowing in the wiring MW1 changes, and decides that the wiring MW1 is in open failure when the current Itest flowing in the wiring MW1 is constant (not change).

As described above, in the wiring open detection circuit 100 of the first embodiment, the drivers DRIV1-DRIV4, the driver DRIVn−1, the driver DRIVn, the wirings MW1-MW4, the wiring MWn−1, the wiring MWn, the terminals PAD1-PAD4, the terminal PADn−1, the terminal PADn, the diodes D1-D4, the diode Dn−1, the diode Dn, the test bus TB, and the open decision circuit 1 are provided. The open decision circuit 1 applies the test bus applied voltage Vtb to the other end of the diode D1 via the test bus TB. The open decision circuit 1 detects change in the current Itest flowing in the wiring MW1 to decide whether or not the wiring MW1 is open.

For the reason, it is possible for the first embodiment to promptly execute decision whether or not a plurality of the wirings are open using a simple configuration.

In the first embodiment, the cathode of the diode is connected to the terminal, and the anode of the diode is connected to the test device, but an embodiment is not necessarily limited to this. For example, a wiring open detection circuit 100a of a first modification shown in FIG. 10 may be used.

Figure 10:
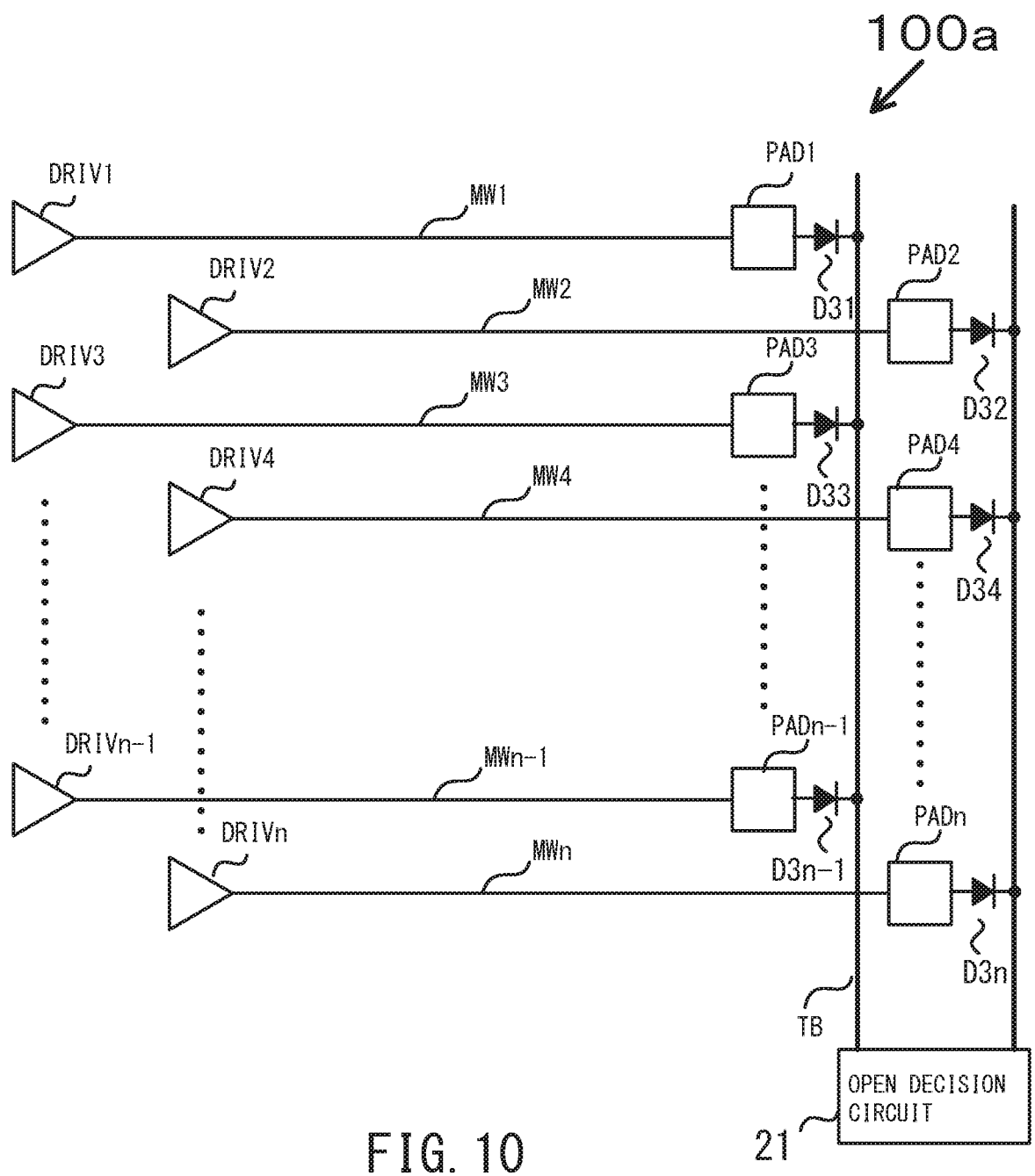
FIG. 10 is a circuit diagram showing a wiring open detection circuit of a first modification.

Specifically, as shown in FIG. 10, a diode D31 has an anode connected to the terminal PAD1, and a cathode connected to the test bus TB. A diode D32 has an anode connected to the terminal PAD2, and a cathode connected to the test bus TB. A diode D33 has an anode connected to the terminal PAD3, and a cathode connected to the test bus TB. A diode D34 has an anode connected to the terminal PAD4, and a cathode connected to the test bus TB. A diode D3n−1 has an anode connected to the terminal PADn−1, and a cathode connected to the test bus TB. A diode D3n has an anode connected to the terminal PADn, and a cathode connected to the test bus TB. The test bus TB is connected to an open decision circuit 21.

As shown in FIG. 11A, at the time of a wiring open test, the open decision circuit 21 applies the test bus applied voltage Vtb (first voltage) to the other end (cathode) of the diode D31 via the test bus TB. The open decision circuit 21 detects change in the current Itest flowing in the wiring MW1 (first wiring) to decide whether or not the wiring MW1 is open.

At the time of the wiring open test, the test bus applied voltage Vtb which the open decision circuit 21 applies is set to a positive voltage (first voltage) larger than a breakdown voltage Vbk of the diode D31. As shown in FIG. 11B, the open decision circuit 21 decides that the wiring MW1 is normal (not disconnected) when the current Itest flowing in the wiring MW1 changes, and decides that the wiring MW1 is in open failure when the current Itest flowing in the wiring MW1 is constant (not change).

Figure 4:
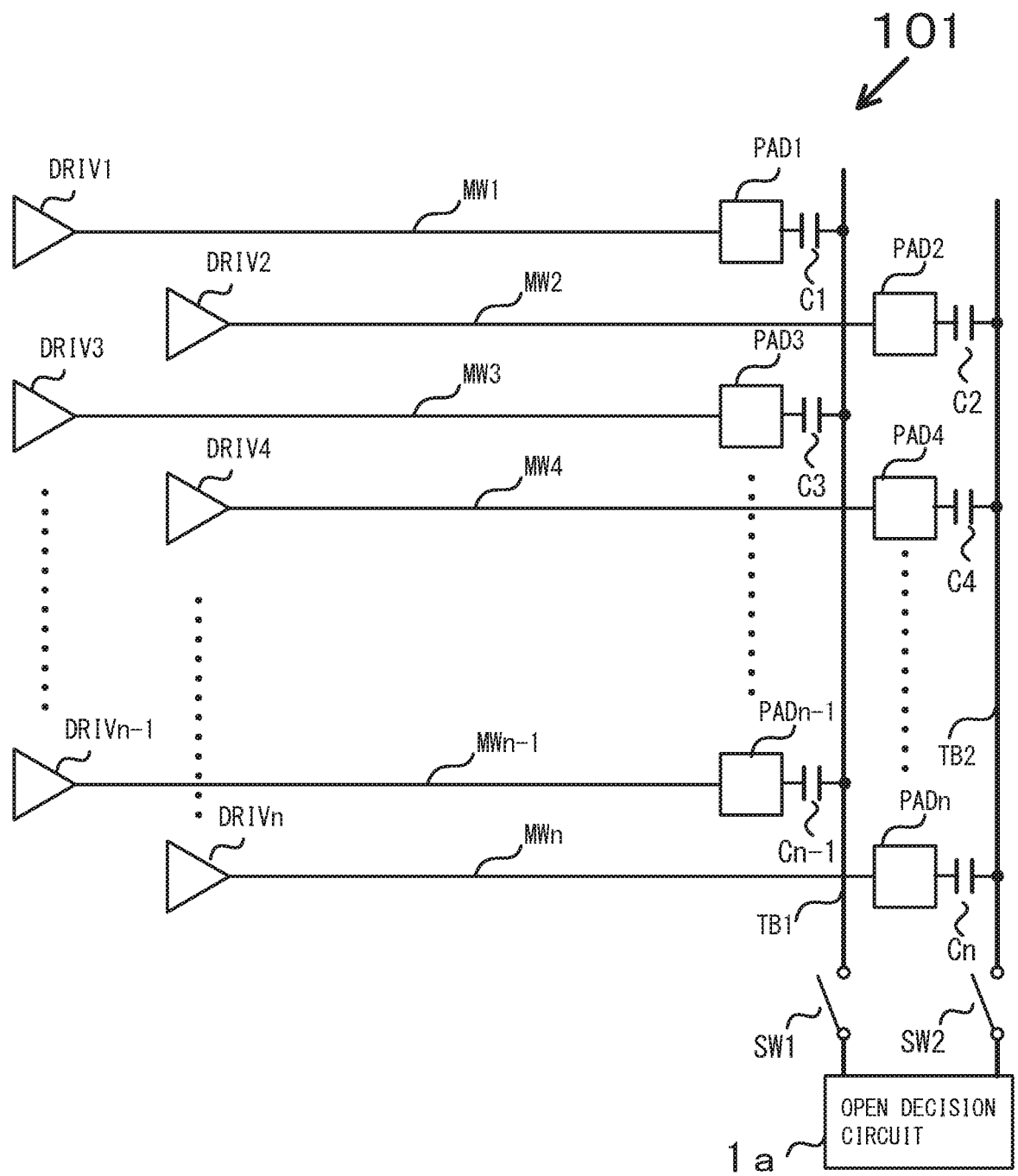
FIG. 4 is a circuit diagram showing a wiring open detection circuit according to a second embodiment.

A wiring open detection circuit according to a second embodiment will be described with reference to the drawings. FIG. 4 is a circuit diagram showing a wiring open detection circuit.

In the second embodiment, as open detection of a long distance wiring to connect between a driver and a terminal, a capacitor is provided between the terminal and an open decision circuit. When electric charge charged in the capacitor is discharged, an analog/digital converter provided in the open decision circuit detects change in a discharge voltage, and the open decision circuit decides whether or not the long distance wiring is open.

Hereinafter, the same symbols are given to the same configuration portions as the first embodiment, and the description of the same portions is omitted, and only the different portions will be described.

As shown in FIG. 4, a wiring open detection circuit 101 includes the drivers DRIV1-DRIV4, the driver DRIVn-1, the driver DRIVn, the wirings MW1-MW4, the wiring MWn-1, the wiring MWn, the terminals PAD1-PAD4, the terminal PADn-1, the terminal PADn, capacitors C1-C4, a capacitor Cn-1, a capacitor Cn, a switch SW1, a switch SW2, a test bus TB1, a test bus TB2, and an open decision circuit 1a.

In the second embodiment, the capacitors C1-C4, the capacitor Cn-1, the capacitor Cn, the switch SW1, the switch SW2, the test bus TB1, and the test bus TB2 are provided to the semiconductor integrated circuit (not shown) including the drivers DRIV1-DRIV4, the driver DRIVn-1, the driver DRIVn, the wirings MW1-MW4, the wiring MWn-1, the wiring MWn, the terminals PAD1-PAD4, the terminal PADn-1, and the terminal PADn, and thereby the open decision circuit 1a decides whether or not each of the wirings MW1-MW4, the wiring MWn-1, and the wiring MWn that is the long distance wiring is open.

The capacitor C1 is an inter-wiring capacitance provided between the terminal PAD1 and the test bus TB1, and charges electric charge by an output signal outputted from the driver DRIV1. The capacitor C3 is an inter-wiring capacitance provided between the terminal PAD3 and the test bus TB1, and charges electric charge by an output signal outputted from the driver DRIV3. The capacitor Cn-1 is an inter-wiring capacitance provided between the terminal PADn-1 and the test bus TB1, and charges electric charge by an output signal outputted from the driver DRIVn-1.

The capacitor C2 is an inter-wiring capacitance provided between the terminal PAD2 and the test bus TB2, and charges electric charge by an output signal outputted from the driver DRIV2. The capacitor C4 is an inter-wiring capacitance provided between the terminal PAD4 and the test bus TB2, and charges electric charge by an output signal outputted from the driver DRIV4. The capacitor Cn is an inter-wiring capacitance provided between the terminal PADn and the test bus TB2, and charges electric charge by an output signal outputted from the driver DRIVn.

The switch SW1 is provided between the test bus TB1 and the open decision circuit 1a. The switch SW2 is provided between the test bus TB2 and the open decision circuit 1a.

When the output signals are constant low level (Vss level) signals, the capacitors C1-C4, the capacitor Cn-1, the capacitor Cn do not charge electric charges, respectively. Since the capacitors C1-C4, the capacitor Cn-1, the capacitor Cn are the inter-wiring capacitances, the accumulated electric charges are gradually discharged.

Here, the inter-wiring capacitance is used as the capacitors C1-C4, the capacitor Cn-1, the capacitor Cn, but a gate capacitance may be used.

Figure 5:
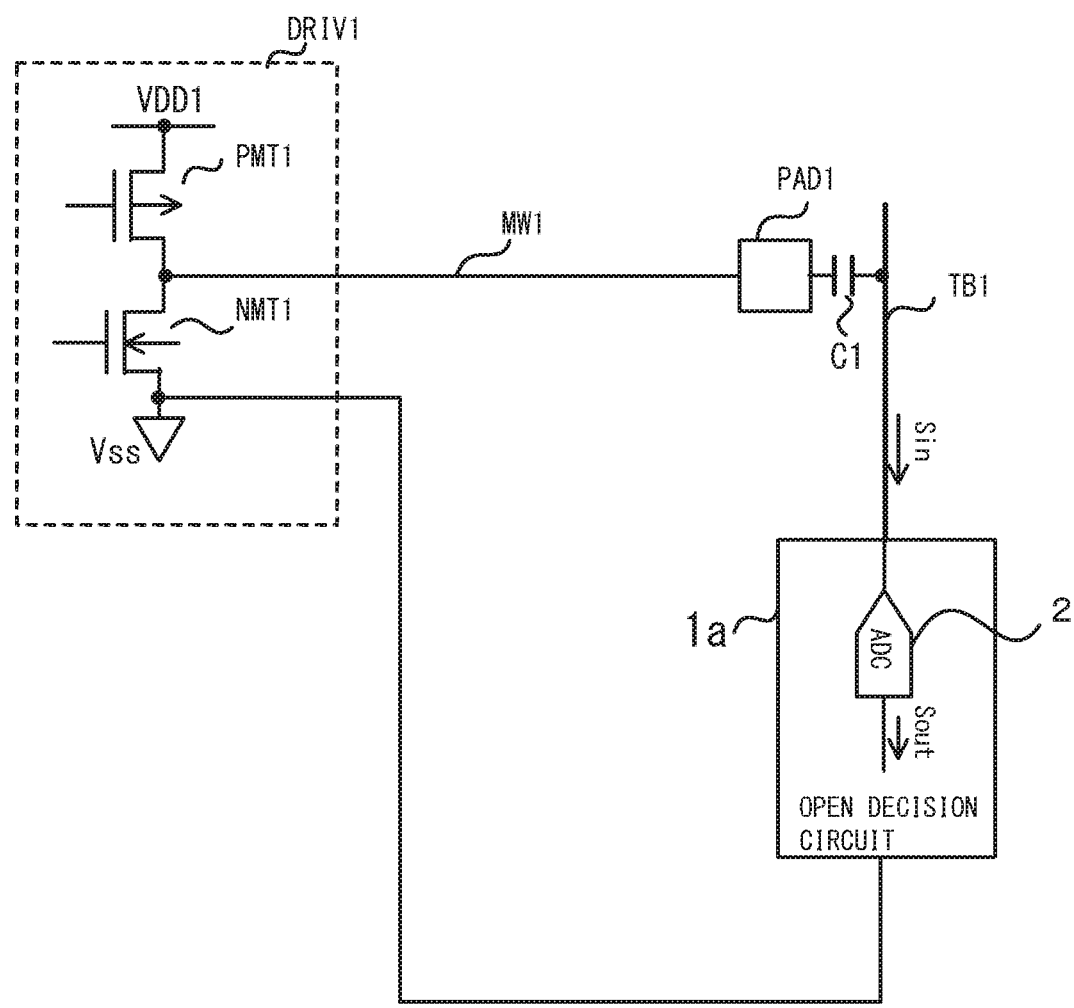
FIG. 5 is a circuit diagram showing a wiring open test according to the second embodiment.

Next, a wiring open test will be described with reference to FIG. 5 and FIG. 6. FIG. 5 is a circuit diagram showing a wiring open test. FIG. 6 is a diagram showing decision result in the wiring open test. Here, an open test of the wiring MW1 will be described as an example. Open tests of the wirings MW2-MW4, the wiring MWn-1, the wiring MWn are the same as that of the wiring MW1, and accordingly, the description thereof will be omitted.

As shown in FIG. 5, the open decision circuit 1a has one end connected to the test bus TB, and the other end connected to the source of the MOS transistor NMT1, and includes an analog/digital converter 2. The capacitor C1 charges electric charge by the high-level output signal outputted from the driver DRIV1, and discharges the accumulated electric charge when the output signal of the driver DRIV1 is at the Vss level. At this time, the switch SW1 is turned on, and the discharge electric charge of the capacitor C1 is inputted to an input side of the analog/digital converter 2 as an input signal Sin. The analog/digital converter 2 executes an analog/digital conversion processing to output an output signal Sout that is a digital signal.

At the time of the wiring open test of the wiring MW1, it is preferable that the output signals outputted from the drivers DRIV2-DRIV4, the driver DRIVn-1, the driver DRIVn are each set to the constant Vss level. The reason is because the capacitors C2-C4, the capacitor Cn-1, the capacitor Cn are not made to be charged and discharged.

As shown in FIG. 6, the open decision circuit 1a decides that the wiring MW1 is normal (not disconnected) when the output signal Sout outputted from the analog/digital converter 2 changes (the high level is Vdd1, and the low level is Vss), and decides that the wiring MW1 is in open failure when the output signal Sout outputted from the analog/digital converter 2 is constant (Vss).

As described above, in the wiring open detection circuit 101 of the second embodiment, the drivers DRIV1-DRIV4, the driver DRIVn-1, the driver DRIVn, the wirings MW1-MW4, the wiring MWn-1, the wiring MWn, the terminals PAD1-PAD4, the terminal PADn-1, the terminal PADn, the capacitors C1-C4, the capacitor Cn-1, the capacitor Cn, the switch SW1, the switch SW2, the test bus TB1, the test bus TB2, and the open decision circuit 1a are provided. The open decision circuit 1a includes the analog/digital converter 2. When the electric charge charged in the capacitor is discharged, the analog/digital converter 2 detects change in the discharge voltage, and the open decision circuit 1a decides whether or not the long distance wiring is open.

For the reason, it is possible for the second embodiment to promptly execute decision whether or not a plurality of the wirings are open using a simple configuration.

In the second embodiment, the capacitor is provided between the terminal and the test bus, but an embodiment is not necessarily limited to this. For example, a wiring open detection circuit 101a of a second modification shown in FIG. 12 in which the capacitor is replaced by a resistor may be used.

Figure 12:
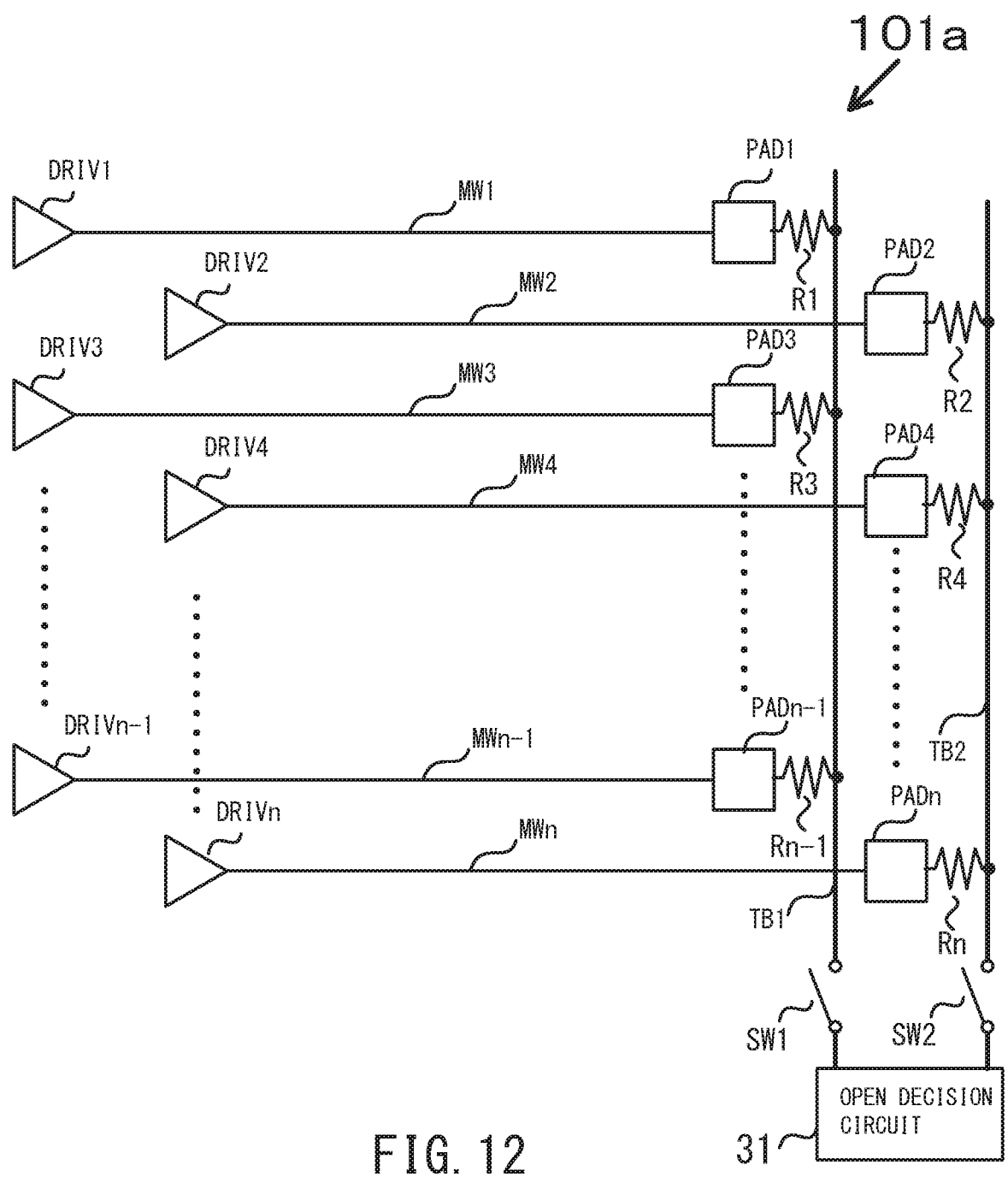
FIG. 12 is a circuit diagram showing a wiring open detection circuit of a second modification.

Specifically, as shown in FIG. 12, a resistor R1 is provided between the terminal PAD1 and test bus TB1. A resistor R2 is provided between the terminal PAD2 and test bus TB2. A resistor R3 is provided between the terminal PAD3 and test bus TB1. A resistor R4 is provided between the terminal PAD4 and test bus TB2. A resistor Rn-1 is provided between the terminal PADn-1 and test bus TB1. A resistor Rn is provided between the terminal PADn and test bus TB2.

The resistors R1-R4, the resistor Rn-1, the resistor Rn are each a resistor having a high resistance value (not less than 1 MO, for example). An open decision circuit 31 is connected to the switch SW1 and the switch SW2.

The open decision circuit 31 inputs the output signal outputted from the driver via the resistor having the high resistance value, and detects change in the current flowing in the long distance wiring to decide whether or not the long distance wiring is open. Here, at the time of a wiring open test of the wiring MW1, it is preferable that the output signals outputted from the drivers DRIV2-DRIV4, the driver DRIVn−1, the driver DRIVn are each set to the constant Vss level.

Figure 7:
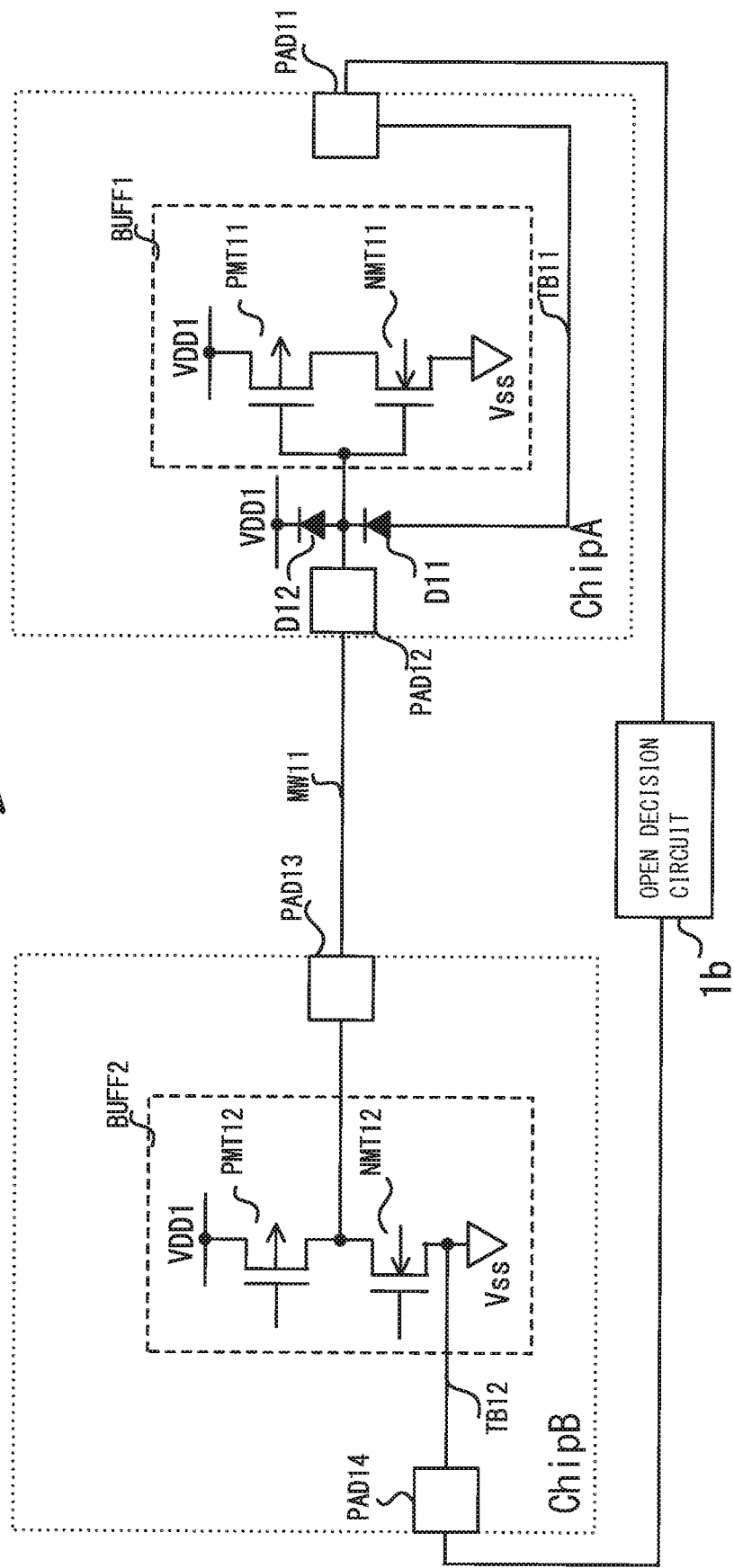
FIG. 7 is a circuit diagram showing a wiring open detection circuit according to a third embodiment.

A wiring open detection circuit according to a third embodiment will be described with reference to the drawings. FIG. 7 is a circuit diagram showing a wiring open detection circuit.

In the third embodiment, a first test bus is provided in a first integrated circuit chip, a second test bus is provided in a second integrated circuit chip, and an open decision circuit decides whether or not a wiring to connect the first integrated circuit chip and the second integrated circuit chip.

As shown in FIG. 7, a wiring open detection circuit 102 includes an integrated circuit chip ChipA, an integrated circuit chip ChipB, a wiring MW11, and an open decision circuit 1b.

The integrated circuit chip ChipA includes a buffer BUFF1, a terminal PAD11, a terminal PAD12, a test bus TB11, a diode D11 and a diode D12. The integrated circuit chip ChipA is a semiconductor integrated circuit incorporating a lot of circuits (not shown).

The buffer BUFF1 is an input buffer including a MOS transistor PMT11 and a MOS transistor NMT11.

The MOS transistor PMT11 is a P-channel MOS transistor having a source connected to a power source (high potential side power source) VDD1, and inputs an input signal inputted to a gate via the terminal PAD12. The MOS transistor NMT11 is an N-channel MOS transistor having a drain connected to the drain of the MOS transistor PMT11, s source connected to the ground side potential (low potential side power source) Vss, and inputs the input signal inputted to a gate via the terminal PAD12.

The diode D11 is a protection diode at a low potential side which is provided between the terminal PAD12 and the buffer BUFF1. The diode D11 has a cathode connected to the terminal PAD12. The diode D12 is a protection diode at a high potential side which is provided between the terminal PAD12 and the buffer BUFF1. The diode D12 has a cathode connected to the power source (high potential side power source) VDD1, and an anode connected to the terminal PAD12.

The test bus TB11 (first test bus) has one end connected to the terminal PAD11, and the other end connected to an anode of the diode D11.

The integrated circuit chip ChipB includes a buffer BUFF2, a terminal PAD13, a terminal PAD14, and a test bus TB12. The integrated circuit chip ChipB is a semiconductor integrated circuit incorporating a lot of circuits (not shown).

The buffer BUFF2 (signal processing circuit) is an output buffer which includes a MOS transistor PMT12 and a MOS transistor NMT12 and outputs an output signal to the terminal PAD13.

The MOS transistor PMT12 is a P-channel MOS transistor having a source connected to the power source (high potential side power source) VDD1, and a drain connected to the terminal PAD13. The MOS transistor NMT12 is an N-channel MOS transistor having a drain connected to the drain of the MOS transistor PMT12 and the terminal PAD13, and a source connected to the ground side potential (low potential side power source) Vss. The test bus TB12 (second test bus) has one end connected to the source of the MOS transistor NMT12, and the other end connected to the terminal PAD14.

The wiring MW11 has one end connected to the terminal PAD12, and the other end connected to the terminal PAD13. Here, the wiring MW11 is a via to connect the integrated circuit chip ChipA and the integrated circuit chip ChipB which are formed by lamination, but may be a wiring to connect the integrated circuit chip ChipA and the integrated circuit chip ChipB which are adjacently arranged.

The open decision circuit 1b has one end connected to the terminal PAD11, and the other end connected to the terminal PAD14. At the time of an open test of the wiring MW11, the open decision circuit 1b applies the test bus applied voltage Vtb that is a positive voltage (first voltage) larger than a forward voltage Vf of the diode D11 to the anode of the diode D11 via the test bus TB11 (first test bus) to decide whether or not the wiring MW11 is open.

As described above, in the wiring open detection circuit 102 of the third embodiment, the integrated circuit chip ChipA, the integrated circuit chip ChipB, the wiring MW11, and the open decision circuit 1b are provided. The integrated circuit chip ChipA includes the buffer BUFF1, the terminal PAD11, the terminal PAD12, the test bus TB11, the diode D11, and the diode D12. The integrated circuit chip ChipB includes the buffer BUFF2, the terminal PAD13, the terminal PAD14, and the test bus TB12. The wiring MW11 has one end connected to the terminal PAD12, and the other end connected to the terminal PAD13. The open decision circuit 1b applies the test bus applied voltage Vtb that is the positive voltage (first voltage) larger than the forward voltage Vf of the diode D11 to the anode of the diode D11 via the test bus TB11 to decide whether or not the wiring MW11 is open.

For the reason, it is possible for the third embodiment to promptly execute decision whether or not the wiring MW11 to connect between the integrated circuit chip ChipA and the integrated circuit chip ChipB is open using a simple configuration.

In the third embodiment, the voltage is applied to the anode of the diode D11 that is the protection diode at the low potential side, but an embodiment is not necessarily limited to this. For example, the test bus applied voltage Vtb that is a positive voltage (first voltage) larger than a breakdown voltage of the diode D12 may be applied to the cathode of the diode D12 that is the protection diode at the high potential side to decide whether or not the wiring is open.

Figure 8:
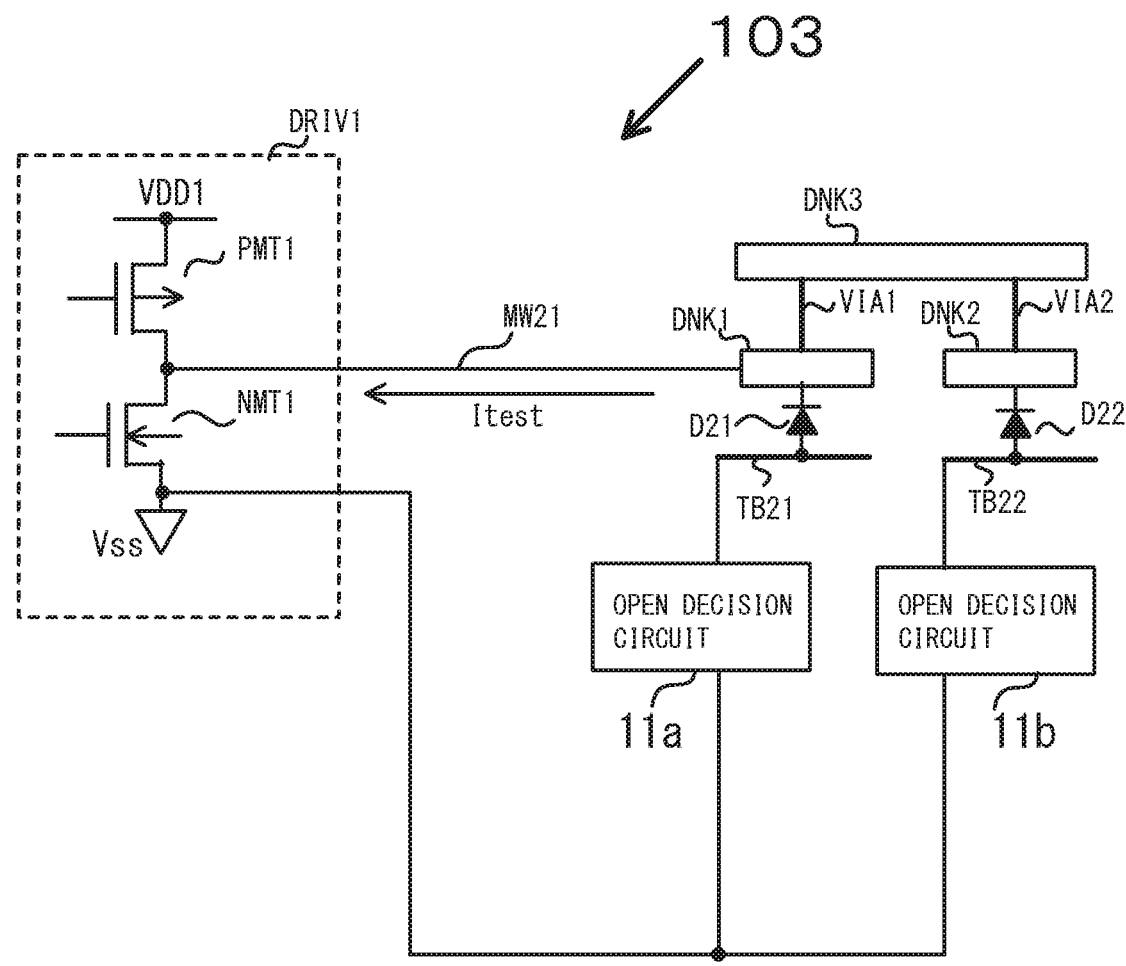
FIG. 8 is a circuit diagram showing a wiring open detection circuit according to a fourth embodiment.

A wiring open detection circuit according to a fourth embodiment will be described with reference to the drawings. FIG. 8 is a circuit diagram showing a wiring open detection circuit.

In the fourth embodiment, in a driver array chip having a lot of long distance wirings and a MEMS array chip connected to the driver array chip via vias, diodes and test buses are provided, and open decision circuits decide whether or not the long distance wiring of the driver array chip is open via the test buses and the vias.

Hereinafter, the same symbols are given to the same configuration portions as the first embodiment, and the description of the same portions is omitted, and only the different portions will be described.

As shown in FIG. 8, a wiring open detection circuit 103 includes the driver DRIV1, a wiring MW21, an open decision circuit 11a, an open decision circuit 11b, a test bus TB21, a test bus TB22, a diode D21, a diode D22, electrodes DNK1-DNK3, a via VIA1, and a via VIA2.

The driver DRIV1, the wiring MW21, the test bus TB21, the test bus TB22, the diode D21, the diode D22, the electrode DNK1, and the electrode DNK2 are included in a driver array chip (not shown) having a lot of long distance wirings. The electrode DNK3 is included in a MEMES array chip (not shown). The MEMS array chip is connected to the driver array chip via the via VIA1, and the via VIA2, and is formed on the driver array chip by stacking.

The wiring MW21 is a long distance wiring having one end connected to the driver DRIV1 and the other end connected to the electrode DNK1. The electrode DNK2 is an electrode which is arranged adjacent to the electrode DNK1, and provided in the same layer of the driver array chip, for example. The electrode DNK3 is an electrode of the MEMS array chip, and has one end connected to the electrode DNK1 via the via VIA1, and the other end connected to the electrode DNK2 via the via VIA2.

The diode D21 has a cathode connected to the electrode DNK1, and an anode connected to the test bus TB21. The diode D22 has a cathode connected to the electrode DNK2, and an anode connected to the test bus TB22.

The open decision circuit 11a has one end connected to the test bus TB21 and the other end connected to the source of the MOS transistor NMT1. The open decision circuit 11b has one end connected to the test bus TB22 and the other end connected to the source of the MOS transistor NMT1.

At the time of a wiring open test, the open decision circuit 11a applies a test bus applied voltage Vtb1 to the anode of the diode D21. At the time of the wiring open test, the open decision circuit 11b applies a test bus applied voltage Vtb2 to the anode of the diode D22.

Next, a wiring open test will be described with reference to FIG. 9A and FIG. 9B. FIG. 9A is a diagram showing an applied voltage in the wiring open test. FIG. 9B is a diagram showing decision result in the wiring open test.

As shown in FIG. 9A, when the driver array chip and the MEMS array chip are in normal operation, the test bus applied voltage Vtb1 and the test bus applied voltage Vtb2 are set to the ground side potential Vss.

At the time of a wiring open test I, the positive test bus applied voltage Vtb1 larger than a forward voltage Vf of the diode D21 is applied to the anode of the diode D21, and the test bus applied voltage Vtb2 of the ground side potential Vss is applied to the anode of the diode D22. At the time of the wiring open test I, the open decision circuit 11a detects change in a current flowing in wirings of a path of the test bus TB21—the diode D21—the electrode DNK1—the wiring MW21 to decide whether or not the wirings are open.

At the time of a wiring open test II, the positive test bus applied voltage Vtb2 larger than a forward voltage Vf of the diode D22 is applied to the anode of the diode D22, and the test bus applied voltage Vtb1 of the ground side potential Vss is applied to the anode of the diode D21. At the time of the wiring open test II, the open decision circuit 11b detects change in a current flowing in wirings of a path of the test bus TB22—the diode D22—the electrode DNK2, the via VIA2—the electrode DNK3—the via VIA1—the electrode DNK1—the wiring MW21 to decide whether or not the wirings are open. In the wiring open test II, whether or not the long distance wiring MW21 of the driver array chip is open is decided via the MEMS array chip.

As shown in FIG. 9B, at the time of the wiring open test I, the open decision circuit 11a detects change in the current Itest flowing in the wirings, and decides that the wirings are normal (not open) when the current Itest changes, and decides that the wirings are in open failure when the current Itest is constant and does not change.

At the time of the wiring open test II, the open decision circuit 11b detects change in the current Itest flowing in the wirings and decides that the wirings are normal (not open) when the current Itest changes, and decides that the wirings are in open failure when the current Itest is constant and does not change.

When the wiring open test I is decided to be normal, and the wiring open test II is decided to be in open failure, it can be decided that the long distance wiring MW21 is normal, and it can be decided that open failure is generated in the path of the electrode DNK2—the via VIA2—the electrode DNK3—the via VIA1, and thereby some sort of abnormality is generated.

As described above, in the wiring open detection circuit 103 of the fourth embodiment, the driver DRIV1, the wiring MW21, the open decision circuit 11a, the open decision circuit 11b, the test bus TB21, the test bus TB22, the diode D21, the diode D22, the electrodes DNK1-DNK3, the via VIA1, and the via VIA2 are provided. At the time of the wiring open test I, the open decision circuit 11a applies the positive test bus applied voltage Vtb1 larger than the forward voltage Vf of the diode D21 to the anode of the diode D21 to decide whether or not the long distance wiring MW21 is open. At the time of the wiring open test I, the open decision circuit 11b applies the positive test bus applied voltage Vtb2 larger than the forward voltage Vf of the diode D22 to the anode of the diode D22 to decide whether or not the long distance wiring MW21 is open through the vias and the electrode of the MEMS array.

For the reason, in addition to the effect of the first embodiment, it is possible for the fourth embodiment to decide whether or not the vias and the electrode of the MEMS array are formed normally.

The first to fourth embodiments, the first modification, and the second modification have been described above, but another embodiment shown below may be used.

Figure 13:
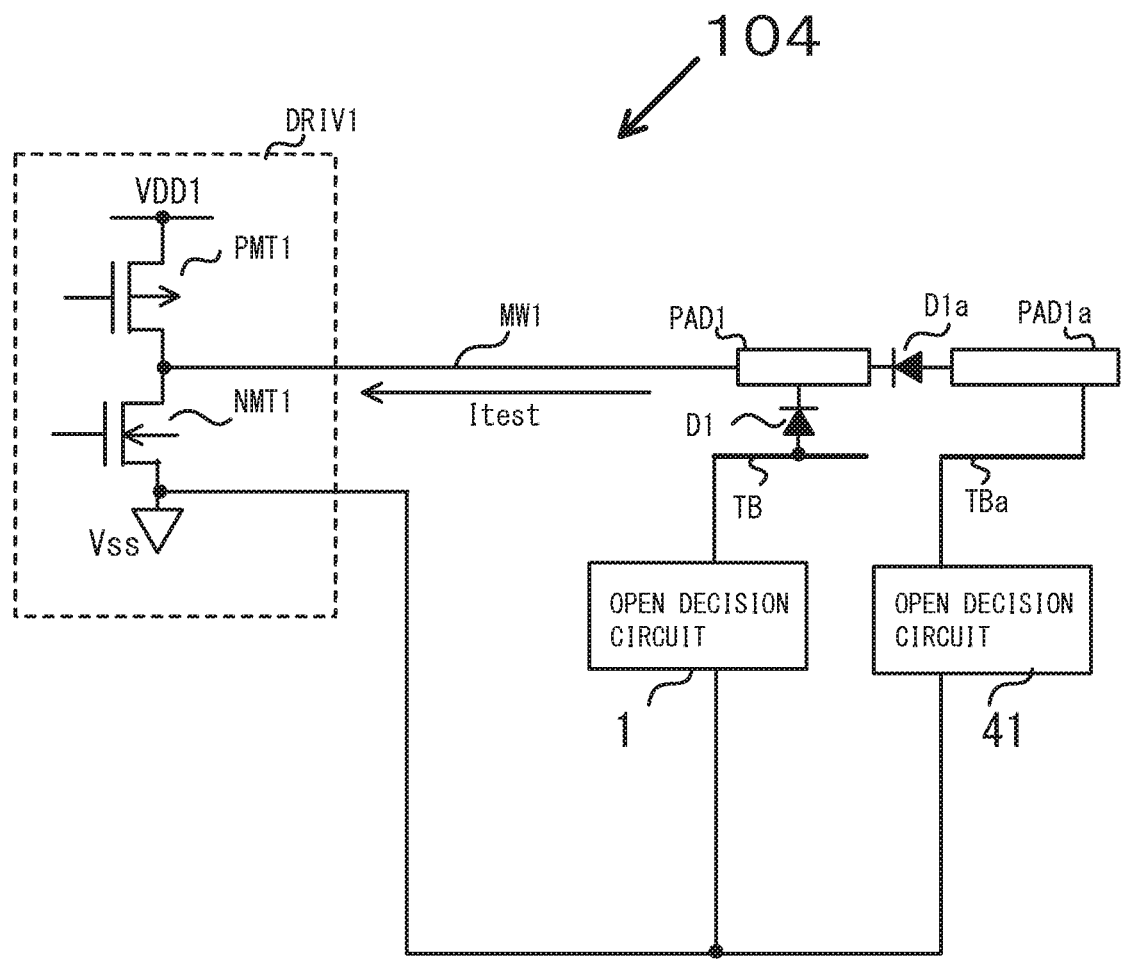
FIG. 13 is a circuit diagram showing a wiring open detection circuit of a third modification.

FIG. 13 is a circuit diagram showing a wiring open detection circuit of a third modification. As shown in FIG. 13, a wiring open detection circuit 104 includes the driver DRIV1, the wiring MW1, the terminal PAD1, a terminal PAD1a, the diode D1, a diode D1a, the test bus TB, a test bus TBa, the open decision circuit 1, and an open decision circuit 41. The wiring open detection circuit 104 is obtained by adding the terminal PAD a, the diode D1a, the test bus TBa, and the open decision circuit 41 to the wiring open detection circuit 100 (refer to FIG. 2) of the first embodiment. Hereinafter, only portions different from the first embodiment will be described.

The diode D1a has a cathode connected to the terminal PAD1, and an anode connected to the terminal PAD1a. The terminal PAD1a is a terminal provided at the ground side potential Vss side in contrast to the terminal PAD1 provided at the driver DRIV1 side.

The open decision circuit 41 has one end connected to the test bus TBa and the other end connected to the source of the MOS transistor NMT1, and is connected to the terminal PAD1a via the test bus TBa.

At the time of a wiring open test, the open decision circuit 41 applies a positive voltage larger than a forward voltage Vf of the diode D1a to the anode of the diode D1a via the test bus TBa and the terminal PAD1a, detects change in the current Itest flowing in the long distance wiring MW1 to decide whether or not the long distance wiring MW1 is open.

Figure 14:
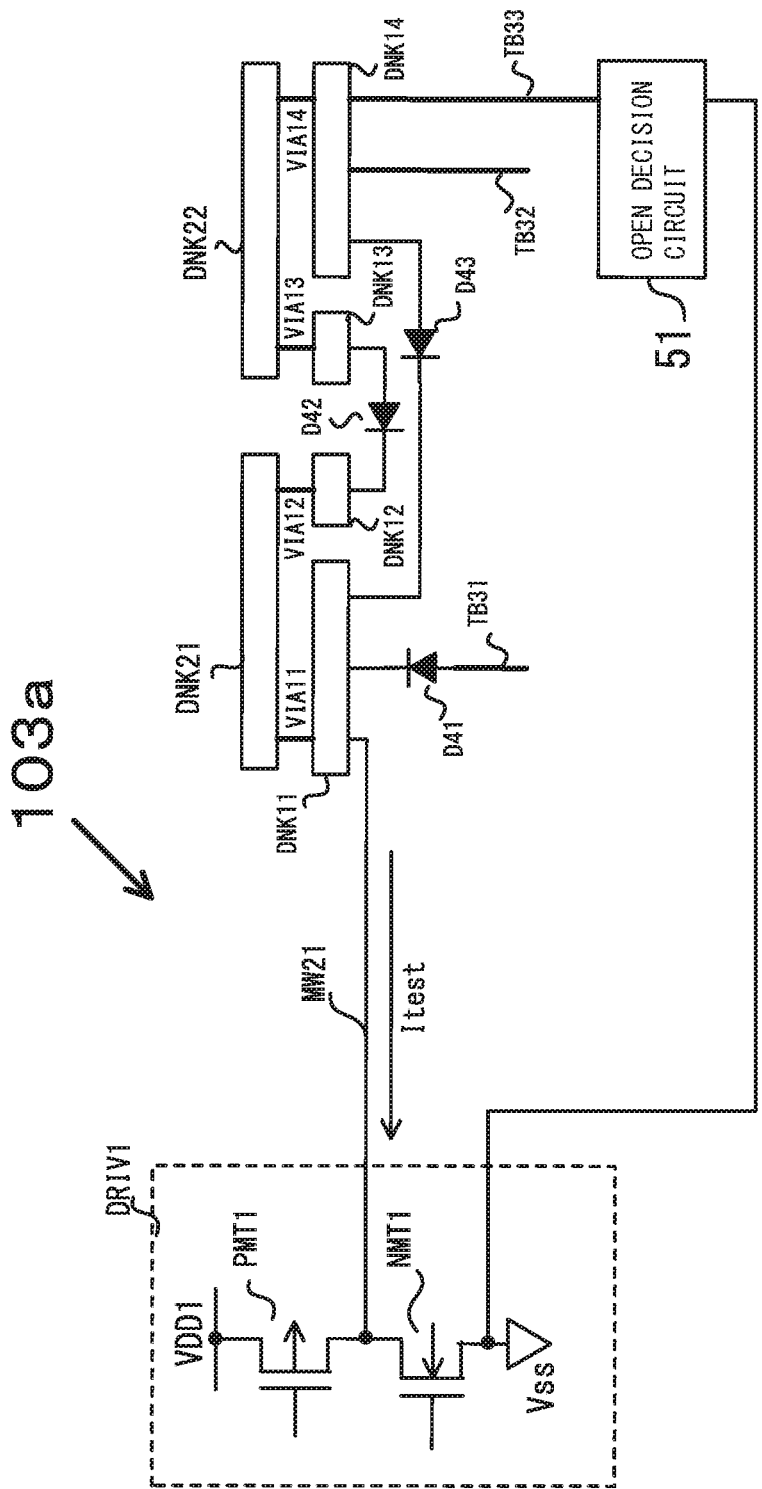
FIG. 14 is a circuit diagram showing a wiring open detection circuit of a fourth modification.

FIG. 14 is a circuit diagram showing a wiring open detection circuit of a fourth modification. As shown in FIG. 14, a wiring open detection circuit 103a includes the driver DRIV1, the wiring MW21, electrodes DNK11-DNK14, an electrode DNK21, an electrode DNK22, vias VIA1-VIA14, diodes D41-D43, test buses TB31-TB33, and an open decision circuit 51. The wiring open detection circuit 103a is obtained by changing and adding to the wiring open detection circuit 103 of the fourth embodiment.

The driver DRIV1, the wiring MW21, the electrodes DNK11-DNK14, the diodes D41-D43, the test buses TB31-TB33, and the open decision circuit 51 are included in a driver array chip. The electrode DNK21, and the electrode DNK22 are included in a MEMS array chip.

The wiring MW21 has one end connected to the driver DRIV1, and the other end connected to the electrode DNK11. The electrode DNK12 is an electrode which is arranged adjacent to the electrode DNK11 and is formed in the same layer as the electrode DNK11 at the ground side potential Vss side, for example. The electrode DNK13 is an electrode which is arranged adjacent to the electrode DNK12 and is formed in the same layer as the electrode DNK11 at the ground side potential Vss side, for example. The electrode DNK14 is an electrode which is arranged adjacent to the electrode DNK13 and is formed in the same layer as the electrode DNK11, for example.

The electrode DNK21 is a MEMS electrode having one end connected to the electrode DNK11 via the via VIA11, and the other end connected to the electrode DNK12 via the via VIA12. The electrode DNK22 is a MEMS electrode at the ground side potential Vss side which has one end connected to the electrode DNK14 via the via VIA14, and the other end connected to the electrode DNK13 via the via VIA13.

The diode D41 has a cathode connected to the electrode DNK11, and an anode connected to the test bus TB31. The diode D42 has a cathode connected to the electrode DNK12, and an anode connected to the electrode DNK13. The diode D43 has a cathode connected to the electrode DNK11, and an anode connected to the electrode DNK14.

The test bus TB32 has one end connected to the electrode DNK14. The test bus TB33 has one end connected to the electrode DNK14, and the other end connected to the open decision circuit 51.

The open decision circuit 51 has one end connected to the test bus TB33, and the other end connected to the source of the MOS transistor NMT1.

Regarding an applied voltage in a wiring open test of the wiring open detection circuit 103a, as shown in FIG. 15A, at the time of normal operation of the driver array and the MEMS array, the open decision circuit 51 applies the test bus applied voltage Vtb1 that is the ground side potential Vss to the anode of the diode D41, applies the test bus applied voltage Vtb2 that is the ground side potential Vss to the anode of the diode D43, and applies a test bus applied voltage Vtb3 that is the ground side potential Vss to the anode of the diode D42.

At the time of a wiring open test of the wiring open detection circuit 103a, the open decision circuit 51 applies the test bus applied voltage Vtb3 that is a positive voltage larger than a forward voltage Vf of the diode D42 to the anode of the diode D42, via the test bus TB33, the electrode DNK14, the via VIA14, the electrode DNK22, the via VIA13, and the electrode DNK13. At this time, the test bus applied voltage Vtb1 and the test bus applied voltage Vtb2 are set to the ground side potential Vss.

At the time of the wiring open test, the open decision circuit 51 detects the current Itest flowing in the long distance wiring MW21, via the test bus TB33—the electrode DNK14—the via VIA14—the electrode DNK22—the via VIA13—the electrode DNK13—the diode D42—the electrode DNK12—the via VIA12—the electrode DNK21—the via VIA11—the electrode DNK11 to decide whether or not the long distance wiring MW21 is open.

At the time of the wiring open test, as shown in FIG. 15B, the open decision circuit 51 decides that the wiring MW21 is normal (not disconnected) when the current Itest flowing in the wiring MW21 changes, and decides that the wiring MW21 is in open failure when the current Itest flowing in the wiring MW21 is constant (not change).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wiring open detection circuit comprising:
    a signal processing circuit connected to one end of a first wiring to output a signal processed signal to the first wiring;
    a terminal connected to the other end of the first wiring;
    a diode having one end connected to the terminal; and
    an open decision circuit configured to apply a first voltage to the other end of the diode, and to detect change in a current flowing in the first wiring to decide whether or not the first wiring is open.

2. The wiring open detection circuit according to claim 1, further comprising:
    a test bus provided between the diode and the open decision circuit.

3. The wiring open detection circuit according to claim 2, wherein
    the signal processing circuit, the first wiring, the terminal, the diode, and the test bus are provided in a semiconductor integrated circuit.

4. The wiring open detection circuit according to claim 3, wherein
    the one end of the diode is a cathode,
    the other end of the diode is an anode, and
    the first voltage is a positive voltage larger than a forward voltage of the diode.

5. The wiring open detection circuit according to claim 4, wherein
    when the semiconductor integrated circuit is in normal operation, the first voltage is set to a ground side potential, and
    at the time of an open test of the first wiring, the first voltage is set to the positive voltage larger than the forward voltage of the diode, and when the current flowing in the first wiring changes, the first wiring is decided not to be disconnected, and when the current flowing in the first wiring is constant, the first wiring is decided to be in open failure.

6. The wiring open detection circuit according to claim 3, wherein
    the one end of the diode is an anode,
    the other end of the diode is a cathode, and
    the first voltage is a positive voltage larger than a breakdown voltage of the diode.

7. The wiring open detection circuit according to claim 6, wherein when the semiconductor integrated circuit is in normal operation, the first voltage is set to a ground side potential, and at the time of an open test of the first wiring, the first voltage is set to the positive voltage larger than the breakdown voltage of the diode, and when the current flowing in the first wiring changes, the first wiring is decided not to be disconnected, and when the current flowing in the first wiring is constant, the first wiring is decided to be in open failure.

8. The wiring open detection circuit according to claim 3, wherein the first wiring includes a plurality of metal wirings arranged in parallel in the semiconductor integrated circuit, the metal winding having a length not less than 1 mm.

9. The wiring open detection circuit according to claim 3, wherein the signal processing circuit is an output buffer provided at an output side of the semiconductor integrated circuit.

* * * * *